United States Patent
Divin et al.

[11] Patent Number: 6,156,706
[45] Date of Patent: Dec. 5, 2000

[54] LAYER STRUCTURE WITH AN EPITAXIAL, NON-C-AXIS ORIENTED HTSC THIN FILM

[75] Inventors: Yuri Divin, Jülich; Jin-Won Seo, Aachen; Ulrich Poppe, Düren, all of Germany

[73] Assignee: Forschungszentrum Julich GmbH, Julich, Germany

[21] Appl. No.: 09/091,851

[22] PCT Filed: Dec. 18, 1996

[86] PCT No.: PCT/DE96/02475

§ 371 Date: Jun. 22, 1998

§ 102(e) Date: Jun. 22, 1998

[87] PCT Pub. No.: WO97/23896

PCT Pub. Date: Jul. 3, 1997

[30] Foreign Application Priority Data

Dec. 22, 1995 [DE] Germany ............................. 195 49 291
Nov. 21, 1996 [DE] Germany ............................. 196 48 234

[51] Int. Cl.[7] ...................................................... B32B 18/00
[52] U.S. Cl. ............................ 505/239; 505/701; 428/930
[58] Field of Search ..................................... 505/239, 701, 505/238; 428/930; 427/62

[56] References Cited

FOREIGN PATENT DOCUMENTS 3-242320 10/1991 Japan .

OTHER PUBLICATIONS

Kromann et al, J. Appl. Phys. 71(7) pp. 3419–3426, Apr. 1992.

Sung et al, Appl. Phys. Lett. 67(8), pp. 1145–1147, Aug. 1995.

Homma et al, Appl. Phys. Lett. 59(11), pp. 1383–1385, Sep. 1991.

"Transition from (110) to (103)/(013) growth in $Y_1Ba_2Cu_3O_{7-x}$ thin filmns on (110) $SrTiO_3$ substrates" by Poelders et al. (Physica C 247(1995) 309–318).

"Growth mechanisms and properties of 90°C. grain boundaries in $Yba_2Cu_3O_7$ thin films" By Eom et al. (1992 The American Physical Society) vol. 46, No. 18, pp. 11902–11913.

*Primary Examiner*—Roy V. King
*Attorney, Agent, or Firm*—Herbert Dubno

[57] ABSTRACT

The invention relates to a layered structure with at least one epitaxial, non-c-axis oriented high Tc superconductor (HTSC) thin film with an approximately tetragonal structure, in which the thin film having an orientation (−1,0,1) is formed on a cubic or pseudocubic (1,0,3) $NdGaO_3$ substrate.

2 Claims, 4 Drawing Sheets

LAYER STRUCTURE WITH AN EPITAXIAL, NON-C-AXIS ORIENTED HTSC THIN FILM

CROSS REFERENCE TO RELATED APPLICATIONS

This application is a national stage of PCT/DE 96/02475 filed Dec. 18, 1996 and based in turn on German National Applications 195 49 291.9 of Dec. 22, 1995 and 196 48 234.8 of Nov. 21, 1996 under the International Convention.

FIELD OF THE INVENTION

The invention relates to a layer sequence with at least one epitaxial non c-axis oriented high temperature superconductor thin film, especially one which is approximately oriented to the a-axis or b-axis, or a structure provided with a layer crystallographically comparable to a high temperature superconductor.

The invention relates, more particularly, to a layer sequence for components used in the field of superconductive electronics and to the production of epitaxial thin films of oxide ceramic high temperature superconductors as well as to materials with similar crystallographic structures which can be used together with high temperature superconductors in epitaxial multilayer systems. These materials have a layer structure with strongly anisotropic characteristics.

BACKGROUND OF THE INVENTION

In high temperature superconductors, the layers contain planar structural units which contain tightly bonded $CuO_2$ planes. These planes also determine substantially the lattice constants a and b within the layer planes (for high temperature superconductors a≈b≈3.9 Angstroms). The layer structure ensures, for example, a high critical current density and a relatively large coherence length in the layer planes as well as a small critical current perpendicular to the layer planes along the crystallographic c-axis.

In order to produce, for example, components with planar high temperature superconductor (HTSC) Josephson contacts it has been desirable to produce very many simple layer sequences as required and to provide an access to the film surfaces of the well-conducting a, b planes of the Josephson contact electrodes (or to the later internal boundary surfaces of the Josephson contacts).

Furthermore it is important to prepare the epitaxial thin films as unidirectionally oriented domains which avoid grain boundaries. Grain boundaries between differently oriented domains give rise to undesirably weakened superconductive regions which disrupt the function of the component.

The epitaxial HTSC thin films are as a rule grown on (preferably perovskite-like) substrates with cubic or pseudocubic (slightly distorted from the cubic) crystal structures with the greatest possible matching of the lattice constants ($a_{substrate} \approx a_{film} \approx b_{film}$).

Typically the lattice defect match $$\frac{a_{substrate} - a_{film}}{a_{substrate}}$$

is less than several percent.

On (001) oriented substrates, up to now, epitaxial HTSC thin films have been deposited with layer planes perpendicular to normals to the substrate surface as is shown in FIG. 1a and which are described as c-axis oriented films, the deposition being effected at relatively high substrate temperatures which has its basis in the fact that, as a rule, only such films have the characteristics necessary for applications which require a relatively high current carrying capacity.

An orientation with the conducting planes perpendicular to the surface can be achieved only for relatively low substrate temperatures. These so-called a-axis oriented films are comprised of domains with opposite c-axes oriented perpendicularly to one another in the thin film plane. Both the low substrate temperature and the resulting grain boundaries between the domains give rise to a diminution of the superconductive characteristics of these films as is known for example from Journal of Appl. Phys., 70, (1991), 7167 or Physica C 194, (1992), 430.

Phys. Rev. B. 46, (1992), 11902 or Proceedings of European Conf. on Appl. Superconductivity (EUCAS '93), Oct. 4–8, 1993, Göttingen, describe the growth of thin films for (101)-oriented substrates at high substrate temperatures with (103)-oriented or ($\bar{1}$03)-oriented domains, whose $CuO_2$ planes are tilted by 45° to the substrate surface. These so-called (103)-films have a very complicated microstructure with different types of 90° different grain boundaries between the two domains of orientation. In this case, the crystal growth front does not run, during the thin film deposition, parallel to the (103)-plane, i.e. the film surface is very rough and gives rise to the fact that only a small part of the conductive $CuO_2$ layer planes reach the film surface.

Furthermore, from Appl. Phys. Lett., 61, (1992), 607 it is known to produce (105)-oriented $YBa_2Cu_3O_7$ films on (305) substrates in which the $CuO_2$ planes are tilted by an angle of 31° relative to the substrate surface. The critical current density in the film plane along the ($50\bar{1}$) direction is only about $10^3 A/cm^2$ at 77K and thus is less usable. Furthermore with relatively small tilting angles of the planes, the number of $CuO_2$ planes per unit area of the surface is markedly reduced.

OBJECT OF THE INVENTION

It is therefore an object of the invention to provide a layer sequence, as well as a process for producing such a layer sequence, whereby a reduction of these drawbacks is achieved.

These objects are achieved by a layered structure with at least one epitactic non-c-axis-oriented high temperature superconductor (HTSC) thin film with approximately tetragonal structure whereby a cubic or pseudocubic substrate is bonded with this thin film, characterized in that the thin film has an orientation ($\bar{K}$01) with respect to the film surface and the $\bar{K}(=-K)$ assumes a value from the range K=1,2, . . .

The layered structure also can comprise at least one epitactic non-c-axis-oriented high temperature superconductor (HTSC) crystallographically comparable approximately tetragonal layer structure with approximately tetragonal structure whereby a cubic or pseudocubic substrate is bonded with this crystallographically comparable approximately tetragonal layer structure, characterized in that the crystallographically comparable approximately tetragonal layer structure has an orientation ($\bar{K}$01) with respect to the film surface and the $\bar{K}(=-K)$ assumes a value from the range K=1,2, . . . .

The invention provides a layer sequence or a manufacturing technique for epitaxial thin films for materials with a layer structure which has c-axis tilted to a normal to the substrate (axis perpendicular to the layer planes) and in which only one kind of domain with the same orientation of the c-axis arises.

Thus a layer sequence is obtained together with a process for producing an epitaxial material with a layer structure having a quasi-rational ratio of the lattice constants within the layer planes (a, b) to the lattice constants perpendicular to the layer planes, in which the layer sequences have very good crystal quality and a crystal orientation in which a high number of conductive planes reach the film surface.

To obtain epitaxial thin layers of materials with a layer structure, especially HTSC, but also others of materials comparable to HTSC, with the aforementioned characteristics, the following are the requirements.

It must be first recognized that the layer material approximates a rational ratio between the lattice constants $a_{Film}$ ($\approx b_{Film}$) within the lattice plane and the lattice constant $c_{Film}$ perpendicular to the planes:

$$c_{Film} \approx N \times a_{Film},$$

N=2,3,4 . . . .
Then, for the deposition on a cubic or pseudocubic (slightly distorted from the cubic) substrate of a thin film with the lattice constants $$a_{Substrate} (\approx b_{Substrate} \approx c_{Substrate})$$

with reduced defect matching of the deposited film ($a_{Substrate} \approx a_{Film}$), the crystallographic orientation is selected from the family {10M} whereby M=K×N and K=1,2 . . . .

The film thus assumes the orientation ($\bar{K}$01) for K=1 in the layer formation. Preferably K=1 is chosen. When for higher values of K unavoidable irregularities of the substrate surface can generate growth disruptions, such K vales are also suitable.

In the case K=1, there is the greater energy difference between a film which has domains of $(10N^2)$-orientation or antidomain ($\bar{1}$01)-orientation. Because of local boundary layer defects or the antiphase boundaries indicated in FIG. 1b, the growth of domains are suppressed with respect to the ($\bar{1}$01)-oriented antidomains. This yields, for the case K=1 and N=3 a good microstructure of a film of ($\bar{1}$01)-oriented antidomains with a tilt angle of the CuO$_2$ film planes of about 72° relative to the substrate surface (see FIG. 1c).

These provisions ensure a good crystal structure of the grown films with a unitary orientation of the layer planes as well as a strong tilting of the planes with respect to the substrate normal.

BRIEF DESCRIPTION OF THE DRAWING

The above and other objects, features, and advantages will become more readily apparent from the following description, reference being made to the accompanying drawing in which.

EXAMPLES

Specific Description

Figure 1A:
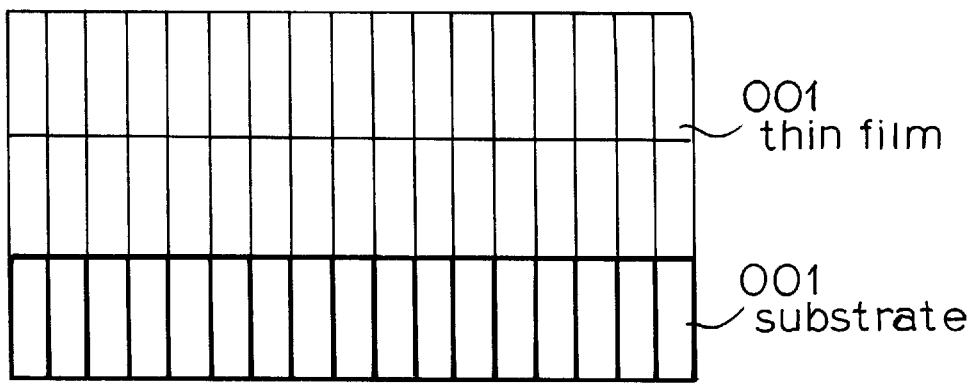
FIG. 1a is a diagrammatic cross section of a (001)-substrate with a (001) thin film.

For clarification, as an example, initially the possibly different arrangements of the crystal lattice of a layer material with the lattice constant $c_{Film} \approx 3 \times a_{Film}$ on a cubic substrate with the lattice constants $a_{Substrate} \approx a_{Film}$, and the orientation (100) (FIG. 1a) and (103) (FIGS. 1b, 1c) are discussed more precisely. One such case is approximately that of a YBa$_2$Cu$_3$O$_7$ film on an NdGaO$_3$ substrate which experimentally has been shown to have the following lattice constants

| $a_{NdGaO3}^{pseudo}$ | $\approx 3.87$ Å | $b_{YBa2Cu3O7}$ | $\approx 3.88$ Å |
|---|---|---|---|
| $a_{YBa2Cu3O7}$ | $\approx 3.82$ Å | $c_{YBa2Cu3O7}$ | $\approx 11.7$ Å |

Figure 1B:
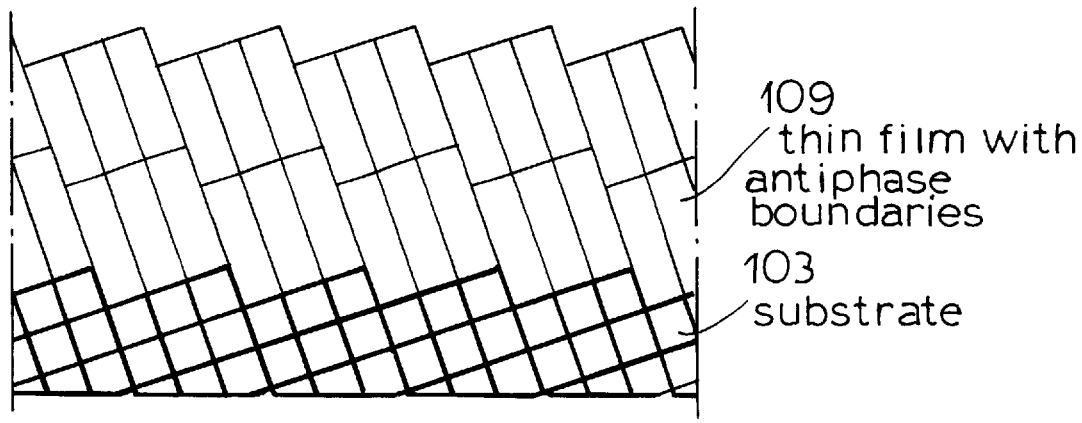
FIG. 1b is a diagrammatic section through a (103)-substrate with a (109)-thin film.
Figure 1C:
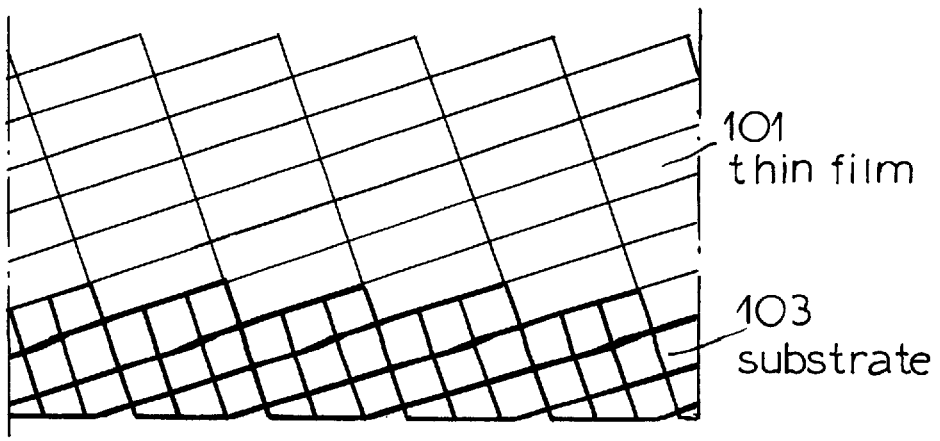
FIG. 1c is a diagrammatic section through a (103)-substrate with a (101)-thin film

The comparison of FIG. 1b and FIG. 1c shows that the ($\bar{1}$01)-oriented film in FIG. 1c by comparison to the (109)-oriented film of FIG. 1b has no defects like the here indicated antiphase boundaries and that this configuration is thus energetically preferred.

Consequently, the layer material, when it is deposited as much as possible under equilibrium conditions, grows with the orientation which minimizes the energy in the grown film. This is the case, in this example, for the ($\bar{1}$01)-oriented film in FIG. 1c since a film with (109)-orientation has many local defects like antiphase boundaries on the substrate layer which give rise to large stresses in the growing film, above all in the nucleation phase.

Figure 2:
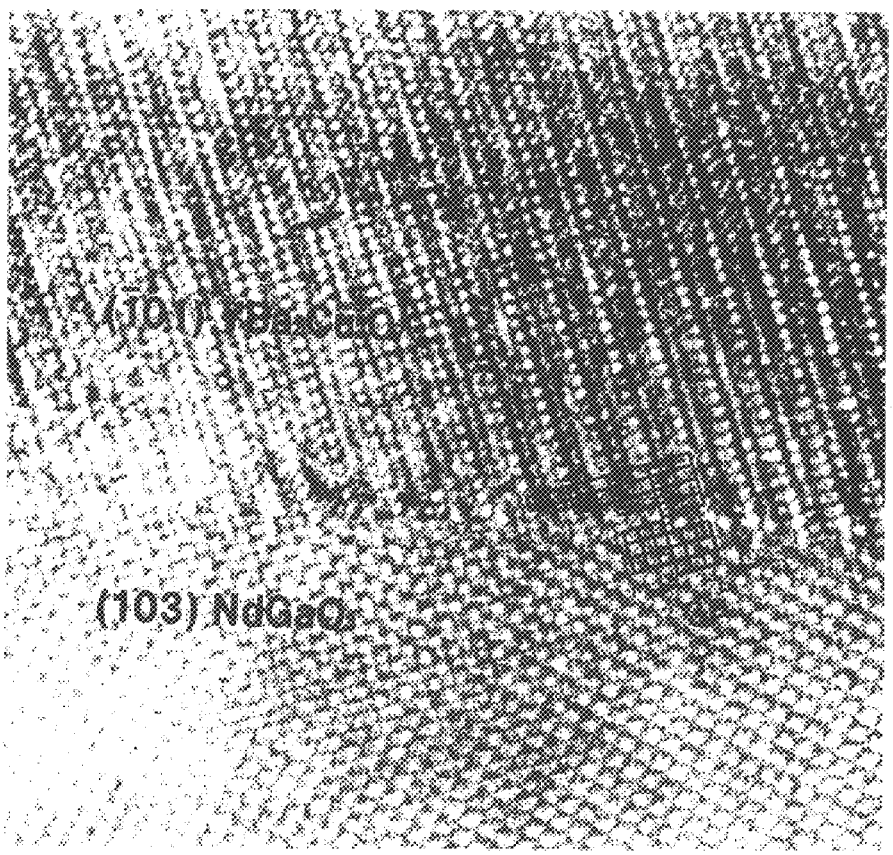
FIG. 2 is an electron microscopic image of a (103)-oriented NdGaO$_3$ substrate (in pseudocubic motion) with a ($\bar{1}$01)-oriented YBa$_2$Cu$_3$O$_7$-HTSC thin film according to FIG. 1c in cross section.

The electron microscopic cross sectional image in FIG. 2 shows a ($\bar{1}$01)-oriented YBa$_2$Cu$_3$O$_7$ thin film on a (103)-NdGaO$_3$ substrate (in pseudo cubic notation). The high resolution transmission electron microscope image allows the layer structure to be distinguished on an atomic scale; the CuO$_2$ planes are tilted at an angle of about 72° with respect to the substrate surface normal.

The indicated thin film is produced by DC oxygen high pressure sputtering at a relatively high substrate temperature n the range for example of 780 to 800° C. and a low deposition rate of about 100 nm/h, because the production conditions are closer to equilibrium than those which apply with more rapid deposition or at lower temperatures. These substrate temperatures are also preferred in order to obtain during the deposition process an epitactic growth of c-axis-oriented YBa$_2$Cu$_3$O$_{7-x}$-films of higher quality on untilted cubic (001) substrates.

It is found in accordance with the invention that for a pseudocubic (103)-NdGaO$_3$ substrate, the orientation of the deposited film is not (109) as one would expect without the above mentioned energetic considerations, but rather the (101) orientation with a strong tilting of the CuO$_2$ layers. The film advantageously has a unitary orientation without regions with complementary (109) domains which can generate disadvantageously disruptive grain boundaries. The layer planes (a, b planes) of the sputtered material are all 71.6° tilted relation to the substrate surface which leads to the fact that all planes reach the film surfaces.

The high quality of the ($\bar{1}$01)-oriented film is mirrored in its electrical transport characteristics. FIGS. 3 and 4 show the anisotropy of the specific resistance and the critical current density of the film as a function of different tilt angles relative to the pseudocubic (001) orientation of the substrate. The different substrate orientations (in pseudocubic notation) are indicated with different symbols. The tilting of the substrate is effected around the (010) direction.

Figure 3A:
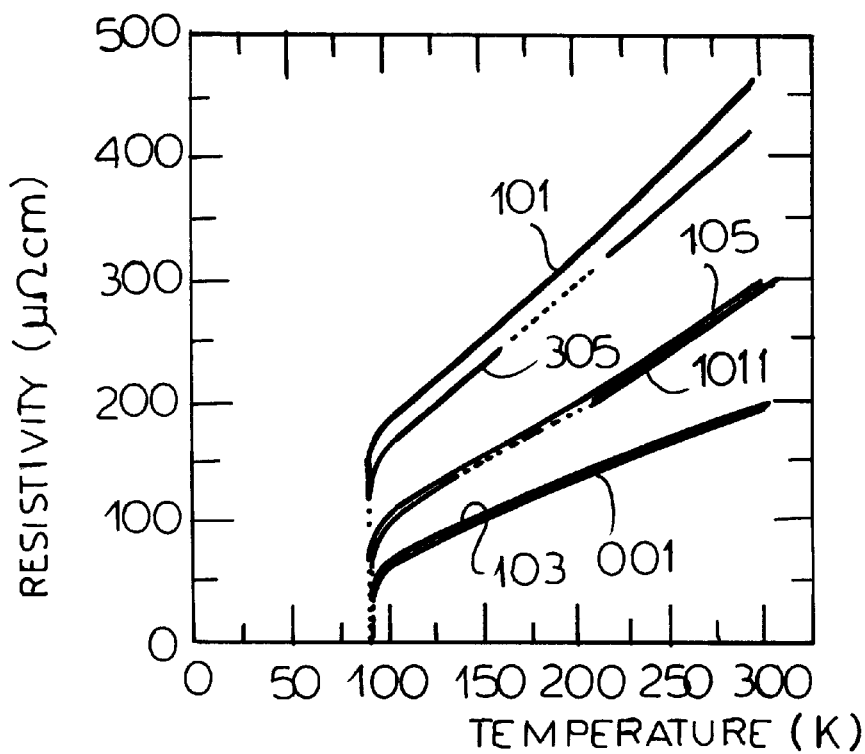
FIG. 3a is a graph of the electrical resistance as a function of the temperature of a ($\bar{1}$01)-oriented film parallel to the tilt.
Figure 3B:
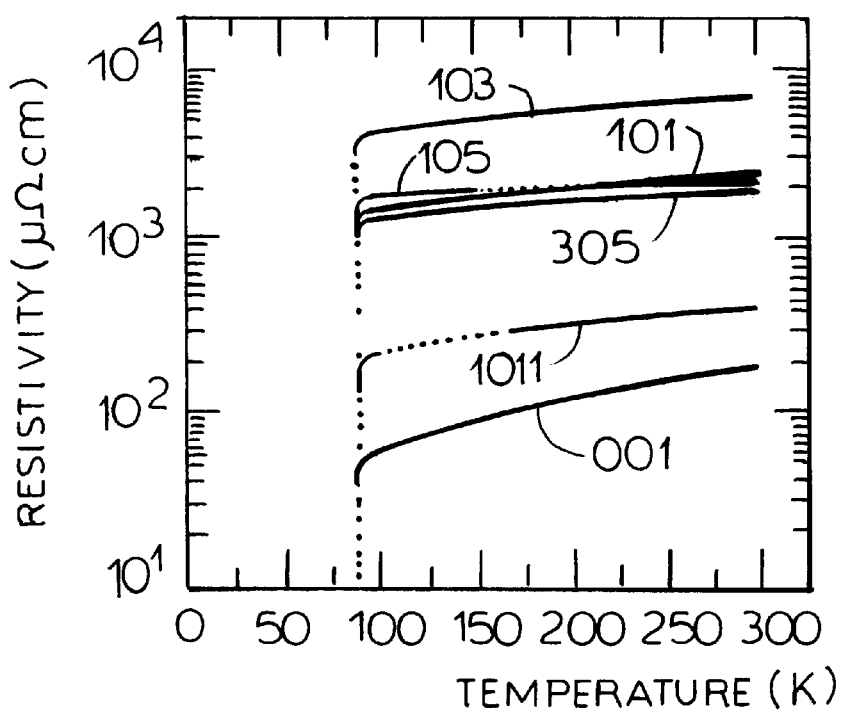
FIG. 3b is the graph of the function where the film is perpendicular to the tilt.

More particularly, in FIG. 3, the specific resistance of a $YBa_2Cu_3O_{7-x}$ thin film on a $NdGaO_3$ substrate with different tilts has been shown and, indeed, in FIG. 3a along the (010) direction of the substrate and in FIG. 3b, perpendicular to the (010) direction of the substrate.

The respective substrate orientations are given in pseudo cubic motion. Only the measurement curve on the (103) oriented substrate is shown with respect to the ($\bar{1}01$) orientation of the grown thin film of an unusual behavior which does not depend monotonically from the substrate tilt. For the tilt angle $\alpha$ of the different substrate orientations one obtains:

$$\alpha_{(001)}\approx 0°, \alpha_{(1\ 0\ 11)}\approx 5°, \alpha_{(105)}\approx 10°,$$

$$\alpha_{(103)}\approx 18°, \alpha_{(305)}\approx 30°, \alpha_{(101)}\approx 45°$$

Figure 4A:
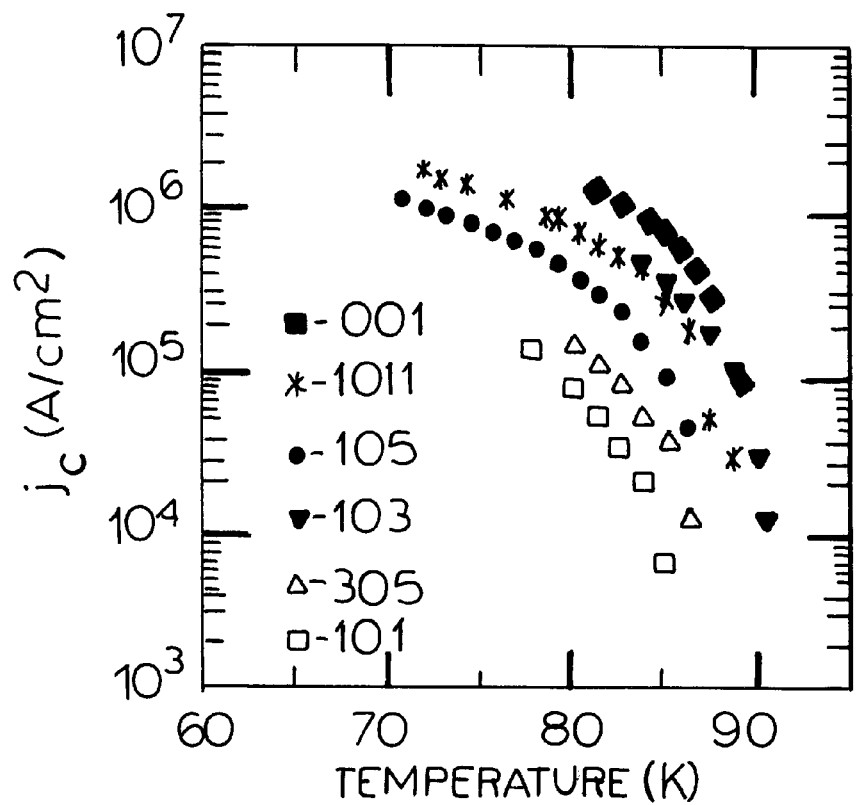
FIG. 4a is a graph of the critical current density as a function of the temperatures of a ($\bar{1}$00)-oriented film parallel to the tilt.
Figure 4B:
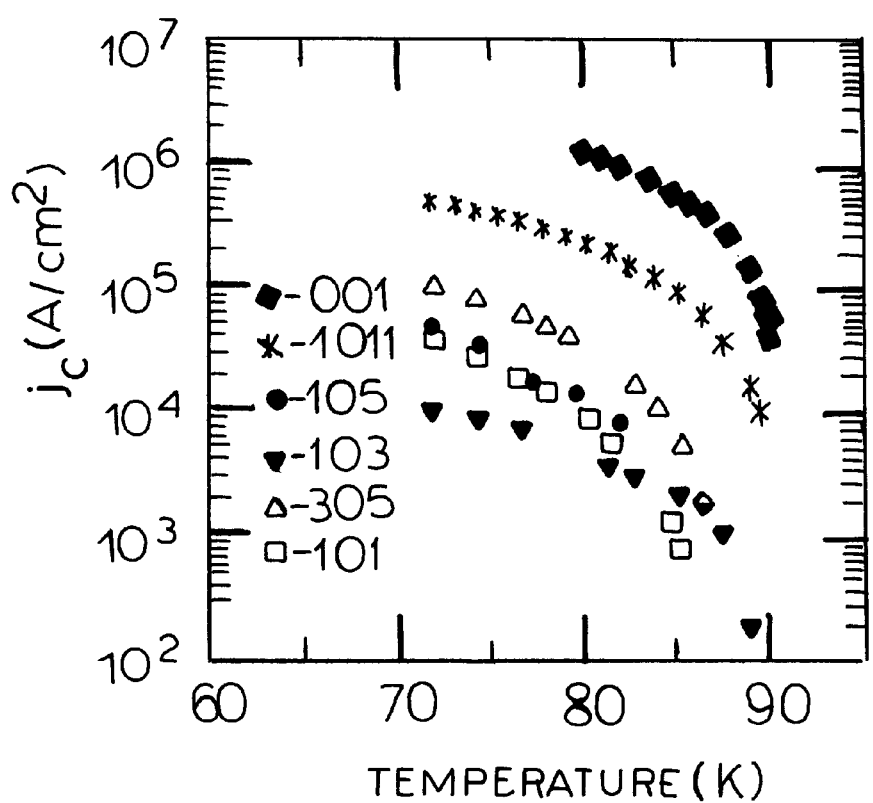
FIG. 4b is a graph of the function where the film is perpendicular to the tilt.

In FIG. 4 the critical current density of a $YBa_2Cu_3O_{7-x}$ thin film on an $NdGaO_3$ substrate is shown with different tilts, in detail, with FIG. 4a illustrating the situation along these (010) direction of the substrate and FIG. 4b perpendicular to the (010) direction of the substrate.

The respective substrate orientation is given in pseudocubic notation. Only the measurement curve on the (103) oriented substrate is indicated with respect to the ($\bar{1}01$) orientation of the grown thin film of an unusual property which 5 does not depend monotonically upon the substrate tilt. For the tilt angle a the different substrate orientations are:

$$\alpha_{(001)}\approx 0°, \alpha_{(1\ 0\ 11)}\approx 5°, \alpha_{(105)}\approx 10°,$$

$$\alpha_{(103)}\approx 18°, \alpha_{(305)}\approx 30°, \alpha_{(101)}\approx 45°.$$

The measurement values for this FIGURE indicate that for a film with ($\bar{1}01$) orientation corresponding to the (103)-orientation of the substrate, the transport characteristics along the conductive $CuO_2$ planes hardly differ from those of an untilted substrate (0°) with (001) orientation.

This singular result with the (103)-orientation of the substrate distinguishes clearly from the common trend of a monotonic reduction of the transport characteristics along the conduction planes with increasing tilt angle of the substrate. With the aid of an analysis it has been found that this is a consequence of the increasing occurrence of grain boundaries between the complementarily oriented domains or antidomains in the thin film and which is only suppressed by the (103) substrate orientations.

The following are also considered part of the invention.

1) A method of producing an epitaxial thin film with a layer structure so that it has a unitary domain structure (i.e. without grain boundaries with differently oriented domains) and the orientation of the layer planes within the domains such that crystallographic direction perpendicular to the layers is tilted by an angle greater than 45° relative to the substrate surface normal.

Here there should be an approximately rational ratio between the lattice constants $a_{Film}$, $b_{Film}$ materials within the layer planes to the lattice constant of the film $c_{Film}$ perpendicular to the layer planes, i.e. $c_{Film}\approx Nxa_{Film}$ (N=2, 3, 4, . . . ).

An approximately rational ratio of the lattice constants means that the deviation is no more than 5%, i.e. for $c_{Film}\approx Nxa_{Film}$ with N=2, 3, 4 . . . ;

$c_{Film}=nxa_{Film}=(N+dN)xa_{Film}$ in which N has the adjacent whole value of n and $dN/N \leq 0.05$ (less than 5% deviation).

The layer material has an approximately tetragonal structure.

Approximately tetragonal structures of the layer material mean that the lattice constants $a_{Film}$ and $b_{Film}$ in the layer planes differ i.e.

$$\left|\frac{a_{Film}-b_{Film}}{a_{Film}}\right| \leq 0.05.$$

The angle deviation from orthogonality between the crystal axes $a_{Film}$, $b_{Film}$ and $c_{Film}$ should not amount to more than 2°:

$$88°\leq(a_{Film}, b_{Film})\leq 92°$$

$$88°\leq(a_{Film}, c_{Film})\leq 92°$$

$$88°\leq(b_{Film}, c_{Film})\leq 92°$$

The substrate material with a cubic or pseudocubic crystal structure the lattice constant $a_{Substrate}$ should be selected for the film deposition with an orientation of the family (1 0 K×N) with K=1,2, . . . .

Approximately cubic (pseudocubic) structure means that the lattice constants $a_{Substrate}$, $b_{Substrate}$, and $c_{Substrate}$, differ by less be than 5%, i.e.

$$\max\left\{\left|\frac{a_{Substrate}-b_{substrate}}{a_{Substrate}}\right|,\left|\frac{a_{Substrate}-c_{Substrate}}{a_{Substrate}}\right|,\right.$$
$$\left|\frac{b_{substrate}-c_{Substrate}}{b_{Substrate}}\right|,\left|\frac{a_{Substrate}-b_{substrate}}{b_{Substrate}}\right|,$$
$$\left.\left|\frac{a_{Substrate}-c_{Substrate}}{c_{Substrate}}\right|,\left|\frac{a_{Substrate}-c_{Substrate}}{c_{Substrate}}\right|\right\} \leq 0.05$$

and the angle deviation from orthogonality (90°) between the crystal axes $a_{Substrate}$, $b_{Substrate}$ and $c_{Substrate}$ does not amount to more than 2°.

The lattice defect matching between film and substrate should be small, $a_{Substrate}\approx a_{Film}\approx b_{Film}$.

Reduced lattice defect matching between thin film and substrate signifies that the deviation amounts to less than 5%, i.e.

$$\left|\frac{a_{Film}-a_{Substrate}}{c_{Substrate}}\right| \leq 0.05$$

The film with this structure grows with the orientation ($\bar{K}01$) where K=1, 2. The case K=1 is significant for practical purposes and has the desired features.

The deposition conditions for the layer material should be so selected, if possible, that they come as close as possible to equilibrium conditions, i.e. the highest possible substrate temperature and a low deposition rate for example.

The following aspects of the invention should be observed (in descending sequence from general to special material):

a) layer structure with anisotropic characteristics whose approximately tetragonal structure is crystallographically comparable to that of the high temperature superconductor (HTSC).

b) high temperature superconductor materials with layered structures which are characterized in that they have at least one $CuO_2$ plane like REBa$_2$Cu$_3$O$_{7-x}$ (RE=Y, La, Gd, Pr, Nd . . . )
HgBa$_2$Ca$_{n-1}$Cu$_n$O$_y$
TlBa$_2$Ca$_{n-1}$Cu$_n$O$_y$
Tl$_2$Ba$_2$Ca$_{n-1}$Cu$_n$O$_y$
Bi$_2$Sr$_2$Ca$_{n-1}$Cu$_n$O$_y$
La$_{2-x}$M$_x$CuO$_4$ (M=Ca, Ba, Sr . . . ) etc.
YBa$_2$Cu$_3$O$_{7-x}$ and (RE Ba$_2$Cu$_3$O$_{7-x}$)

II. Substrate orientations (in descending sequence from general to special orientations).

a) (10M) with M–K×N (N=2, 3, 4 . . . and K=1,2) or thin film materials from Ia), Ib) and Ic).

b) (10N) (K=1) (generally limited to K=1) for thin film materials from Ia), Ib) and Ic).

c) (103) (N=3) for YBa$_2$Cu$_3$O$_{7-x}$ and (REBa$_2$Cu$_3$O$_{7-x}$)

(104) (N=4) for TlBa$_2$Ca$_2$Cu$_3$O$_x$, HgBa$_2$Ca$_2$Cu$_3$O$_x$, T$_{1-\alpha}$M$^1_\alpha$Ba$_{2-\beta}$Sr$_\beta$Ca$_2$Cu$_3$O$_x$, Hg$_{1-\alpha}$M$^1_\alpha$Ba$_{2-\beta}$Sr$_\beta$Ca$_2$Cu$_3$O$_x$ with M$^1$=Pr, Bi, Pb, Ti, Hg, . . .

and other materials with the same structure.

What is claimed is:

1. A layered structure with at least one epitaxial non-c-axis oriented high temperature superconductor (HTSC) thin film with an approximately tetragonal structure and having an orientation (−1,0,1) formed on a cubic or pseudocubic (1,0,3) NdGaO$_3$ substrate.

2. The layered structure according to claim 1 wherein the HTSC thin film has approximately an a-axis orientation or b-axis orientation.

* * * * *